United States Patent
Gajic

(10) Patent No.: US 11,726,129 B2
(45) Date of Patent: Aug. 15, 2023

(54) ENERGY BASED TRANSIENT EARTH-FAULT PROTECTION FOR HIGH IMPEDANCE GROUNDED NETWORKS

(71) Applicant: Hitachi Energy Switzerland AG, Baden (CH)

(72) Inventor: Zoran Gajic, Vasteras (SE)

(73) Assignee: HITACHI ENERGY SWITZERLAND AG, Baden (CH)

( * ) Notice: Subject to any disclaimer, the term of this patent is extended or adjusted under 35 U.S.C. 154(b) by 237 days.

(21) Appl. No.: 16/991,637

(22) Filed: Aug. 12, 2020

(65) Prior Publication Data

US 2021/0048470 A1  Feb. 18, 2021

(30) Foreign Application Priority Data

Aug. 12, 2019 (EP) ..................................... 19191216

(51) Int. Cl.
| | | |
|---|---|---|
| G01R 31/08 | (2020.01) |
| G01R 31/52 | (2020.01) |
| H02H 1/00 | (2006.01) |
| H02H 3/33 | (2006.01) |
| H02H 3/347 | (2006.01) |
| H02H 7/26 | (2006.01) |
| G01R 19/14 | (2006.01) |
| G01R 31/58 | (2020.01) |

(52) U.S. Cl.
CPC ........... *G01R 31/086* (2013.01); *G01R 19/14* (2013.01); *G01R 31/52* (2020.01); *G01R 31/58* (2020.01); *H02H 1/0092* (2013.01); *H02H 3/33* (2013.01); *H02H 3/347* (2013.01); *H02H 7/26* (2013.01); *Y04S 10/52* (2013.01)

(58) Field of Classification Search
CPC ...... G01R 31/086; G01R 31/52; G01R 19/14; G01R 31/58; H02H 1/0092; H02H 3/33; H02H 3/347; H02H 7/26; H02H 3/165; Y04S 10/52
See application file for complete search history.

(56) References Cited

U.S. PATENT DOCUMENTS

2016/0134101 A1* 5/2016 Kalina .................. H02H 3/165
361/47

FOREIGN PATENT DOCUMENTS

| EP | 2624397 A1 * | 8/2013 | .......... G01R 31/088 |
| EP | 2624397 A1 | 8/2013 | |
| EP | 2741389 A1 * | 6/2014 | .......... G01R 31/025 |
| EP | 2741389 A1 | 6/2014 | |
| WO | 2012171694 A1 | 12/2012 | |

* cited by examiner

*Primary Examiner* — Feba Pothen
*Assistant Examiner* — Joseph O Nyamogo
(74) *Attorney, Agent, or Firm* — Slater Matsil, LLP

(57) ABSTRACT

A method for determining direction of an earth fault (EF) in a feeder of a high impedance grounded power system can be performed by an Intelligent Electronic Device (IED). The method includes obtaining a measure of a first order harmonic active current component derived from residual voltage and current of the feeder when the EF occurred in the feeder, obtaining a measure of a higher order harmonic reactive current component derived from the residual voltage and current of the feeder when the EF occurred in the feeder, and determining the direction of the EF in the feeder based on a combination of the first order harmonic active current component and the higher order harmonic reactive current component.

20 Claims, 9 Drawing Sheets

ENERGY BASED TRANSIENT EARTH-FAULT PROTECTION FOR HIGH IMPEDANCE GROUNDED NETWORKS

CROSS-REFERENCE TO RELATED APPLICATIONS

This application claims priority to European Patent Application No. 19191216.1, filed on Aug. 12, 2019, which application is hereby incorporated herein by reference.

TECHNICAL FIELD

Embodiments presented herein relate to energy based transient earth-fault protection for high impedance grounded networks.

BACKGROUND

In general terms, high impedance grounded power systems are characterized by the fact that the power system neutral point is connected to ground via relatively high impedance. One example is an isolated power system where this impedance in practice is infinite. However, natural distributed capacitances between the individual phase conductors and ground are always present in any power system, irrespective of the neutral point grounding.

In general terms, an EF is an inadvertent fault between a live conductor and earth. When an EF occurs, the electrical system, such as a high impedance grounded power system, gets short-circuited and the short-circuited current flows through the system.

Examples of high impedance grounding systems and their relations to EFs will be disclosed next.

A first example is an isolated power system when the grounding impedance is infinite in practice. During an EF in such power system, the EF currents magnitude and transients will be determined only by the natural capacitances of the individual phase conductor to earth. The capacitive EF current might be in the order of several tens, or even hundreds, of amperes depending on the geographical size of the power system and types of lines used (overhead lines (OHLs) or cables). The total capacitive EF current of the whole interconnected network is passing through the fault point. This type of grounding is typically used for lower voltage levels (e.g., distribution). The faulty feeder can be detected by using relays sensitive to the residual current fundamental frequency component $Io*sin(\Phi)$, i.e., a directional EF relay based on the fundamental frequency reactive current component in the measured residual current. The capacitive fault current will flow through the fault point all time.

A second example is a Petersen coil grounded system (i.e., resonance or compensated grounding) when a reactor is used as a grounding impedance. In such systems the inductance of the reactor is tuned to the total natural power system capacitance at rated frequency (e.g., 50 Hz) in order to minimize the EF current at the fault point (i.e., to cancel the capacitive fault current at the fault point).

In principle, the inductive coil current is superimposed on the capacitive EF current in case of a single Petersen coil. These two currents will have different polarity in the fault point, ideally canceling each other. Several variants of Petersen coil grounding exist in practice as exemplified next. Centralized compensation is referred to when only one Petersen coil with regulation facility is used for the entire network. Semi-centralized compensation is referred to when several relatively large coils with regulation possibility (e.g., 9 coils) are used for the entire network. Distributed compensation is referred to when in addition to one large centrally placed coils many small coils are distributed throughout the network in almost all feeders. On a lower voltage levels (distribution), often a resistor which is either permanently or only temporary (i.e., during an EF) connected in parallel with a Petersen coil is also used. This is done to simplify the detection of the faulty feeder by using sensitive $Io*cos(\phi)$ relays (i.e., a directional EF relay based on continuously present fundamental frequency active current component in the measured residual current of the faulty feeder). These relays perform continuous measurements and have suitable definite time delays set in order to avoid possible maloperations.

A third example is high resistive grounding where a high ohmic resistor is used as grounding impedance.

However, there is still a need for improved handling of EFs in high impedance grounded power systems.

SUMMARY

Embodiments presented herein relate to a method, an intelligent electronic device (IED), a computer program, and a computer program product for determining direction of an earth fault (EF) in a feeder of a high impedance grounded power system.

Embodiments disclosed herein can provide efficient handling of EFs in high impedance grounded power systems. In some aspects, this is provided by determining direction of an EF in a feeder of a high impedance grounded power system.

According to a first aspect there is presented method for determining direction of an EF in a feeder of a high impedance grounded power system. The method is performed by an IED. The method comprises obtaining a measure of a first order harmonic active current component derived from residual voltage and current of the feeder as valid for when the EF occurred in the feeder. The method comprises obtaining a measure of a higher than first order harmonic reactive current component derived from residual voltage and current of the feeder as valid for when the EF occurred in the feeder. The method comprises determining the direction of the EF in the feeder based on a combination of the first order harmonic active current component and the higher than first order harmonic reactive current component.

According to a second aspect there is presented an IED for determining direction of an EF in a feeder of a high impedance grounded power system. The IED comprises processing circuitry. The processing circuitry is configured to cause the IED to obtain a measure of a first order harmonic active current component derived from residual voltage and current of the feeder as valid for when the EF occurred in the feeder. The processing circuitry is configured to cause the IED to obtain a measure of a higher than first order harmonic reactive current component derived from residual voltage and current of the feeder as valid for when the EF occurred in the feeder. The processing circuitry is configured to cause the IED to determine the direction of the EF in the feeder based on a combination of the first order harmonic active current component and the higher than first order harmonic reactive current component.

According to a third aspect there is presented an IED for determining direction of an EF in a feeder of a high impedance grounded power system. The IED comprises an obtain module configured to obtain a measure of a first order harmonic active current component derived from residual voltage and current of the feeder as valid for when the EF occurred in the feeder. The IED comprises an obtain module configured to obtain a measure of a higher than first order harmonic reactive current component derived from residual voltage and current of the feeder as valid for when the EF occurred in the feeder. The IED comprises a determine module configured to determine the direction of the EF in the feeder based on a combination of the first order harmonic active current component and the higher than first order harmonic reactive current component.

According to a fourth aspect there is presented a computer program for determining direction of an EF in a feeder of a high impedance grounded power system, the computer program comprising computer program code which, when run on an IED, causes the IED to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously this provides efficient handling of EFs in high impedance grounded power systems.

Advantageously, since the determination of the direction of the EF is based on a combination of two independent operating principles (as defined by the first order harmonic active current component and the higher than first order harmonic reactive current component), the determination mechanism is robust, secure and dependable all at the same time.

Further advantageously, the herein disclosed mechanisms allow for simple implementation because of being based only on the active part of the fundamental frequency component of the residual current phasor and the reactive part of the higher harmonic frequency components of the residual current phasor.

Further advantageously, the herein disclosed mechanisms might use protection principles based on $Io*cos(\Phi)$ for the fundamental frequency component and $Io*sin(\Phi)$ for the higher order harmonic components.

Further advantageously, the herein disclosed mechanisms are independent from the compensation degree, number of coils used and their physical location in the protected network (since Petersen coils do not consume active power).

Further advantageously, the herein disclosed mechanisms allow for integration (implemented as averaging) to be performed continuously, thereby alleviating any need to start/stop this calculation process.

Further advantageously, according to the herein disclosed mechanisms, both the quantity $Io*cos(\Phi)$ and the quantity $\Sigma(Io_h*sin(\Phi_h))$ will be approximately equal to zero during all operating conditions of the IED except during transient charging process of capacitors which occurs during the transient period of the EF, respectively. Consequently, it is relatively simple to determine when these quantities appear. As additional security measure it can be also checked that this coincides with a jump in the magnitude of the residual voltage U0.

Further advantageously, the herein disclosed mechanisms require only a relatively low sampling rate because only the first order harmonic phasors of the residual voltage U0 and the residual current Io and only a few higher than first order harmonic phasors (such as up to and including the 5th harmonic) from the input signal waveform are required to be taken into consideration during the calculations. Thus, a sampling rate of 20 samples per fundamental power system cycle is fully sufficient for proper operation of the herein disclosed mechanisms.

Further advantageously, the herein disclosed mechanisms do not require the use of raw samples of residual voltage and current which simplifies the overall design of the mechanism for determining the direction of the EF.

Further advantageously, the herein disclosed mechanisms are not dependent on any angle-based criteria and hence are free from issues relating to angular accuracy.

Further advantageously, the herein disclosed mechanisms allow for the use of separate operate levels for determining the EF to be in the forward direction and for determining the EF to be in the reverse directions, respectively.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION OF ILLUSTRATIVE EMBODIMENTS

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above, there is still a need for improved handling of EFs in high impedance grounded power systems.

Figure 1:
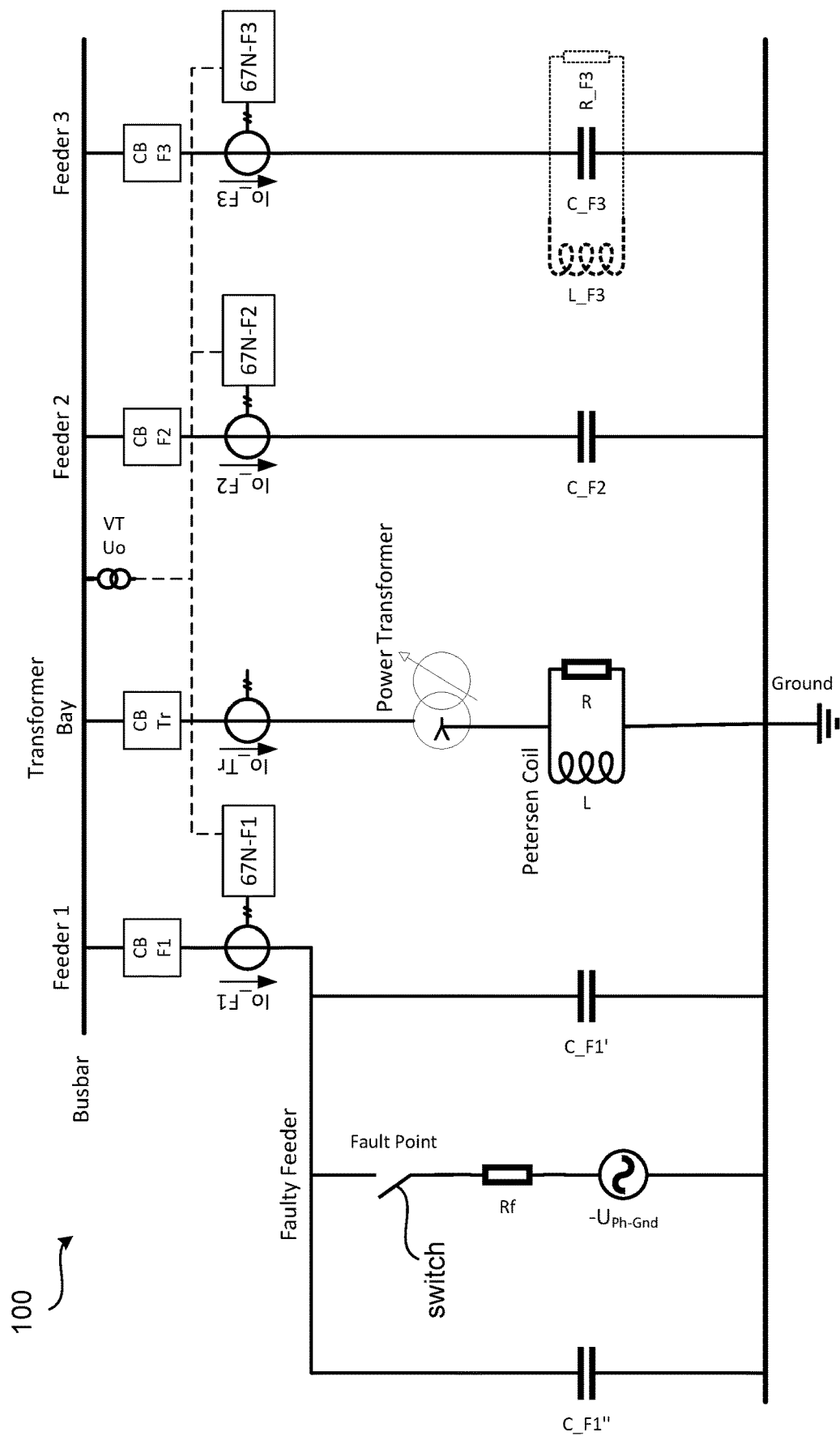
FIG. 1 is a schematic diagram illustrating a zero-sequence equivalent circuit 100 of a high impedance grounded power system according to embodiments.

FIG. 1 is a schematic diagram illustrating a zero-sequence equivalent circuit 100 of a high impedance grounded power system where embodiments presented herein can be applied. In FIG. 1 one transformer bay (i.e., incomer bay) and three feeder bays (hereinafter feeders for short) are shown. Each feeder is represented by a capacitance to ground. A conductance (i.e., 1/R) to ground is shown with dashed lines for Feeder 3, but in practice these resistances are extremely large and can be ignored.

In the zero-sequence equivalent circuit 100 it is assumed that an EF is occurring in the feeder denoted "Feeder 1". The EF position is thus in Feeder 1 and this feeder is referred to as a faulty feeder whereas the remaining feeders are referred to as healthy feeders. Consequently, the capacitance of Feeder 1 is split into two parts.

Location of all current transformers (CTs) and voltage transformers (VTs) are also shown in FIG. 1, which define the positions and directions of current measurements. Finally, connections to transient directional EF relays in each feeder (e.g., 67N-F1 for Feeder 1) are also shown in FIG. 1. The CTs and VTs determine measurement points for the residual voltage U0 and respective residual currents Io in each feeder.

A Petersen coil and an (optional) parallel resistor is provided in the transformer neutral point. In practice, even if the resistor is not physically connected in parallel to the Petersen coil the power losses in the Petersen coil can be represented in this way. An inductance to ground is shown with dashed lines for Feeder 3, what in practice may represent distributed coils along that feeder. The reactance of the Petersen coil is tuned to the reactance of the total capacitance of the system at the rated frequency $f_r$, i.e., $$2*\pi*f_r*L = \frac{1}{2*\pi*f_r*C_{Zo}}$$

As per the superposition theorem, the only voltage source in the equivalent zero-sequence system is located at the fault point. Its magnitude is equal to the faulted phase phase-to-ground voltage just before the EF. However, its phase angle is turned 180 degrees. Assuming that the fault resistance Rf is approximately zero (i.e., the EF is a solid fault) then the residual voltage U0 will be equal to this source voltage. The residual voltage U0 will be the same for all IEDs throughout the system. In practice this means that the difference between a healthy feeder and a faulty feeder when an EF occurs is the measured residual current Io in the individual feeders.

The transient process in such system is similar to an isolated system. The only difference is that the flow of reactive power in the faulty feeder will be different during steady state conditions.

In general terms, a transient process always occurs during a capacitor energization in any power system. For transient EF protection a similar physical process occurs but in the zero-sequence system. Thus, at the moment when the EF occurs (i.e., when switch closes in FIG. 1) the transient active energy must be first supplied to all distributed capacitors from the voltage source located at the fault point in order to charge them to the level of the residual voltage U0. Only once charged these capacitors will start to exchange the reactive energy with the voltage source and the Petersen coil(s). Therefore, if this transient can be measured, or at least detected, by the IED then this short surge of the active energy can also be used to detect a faulty feeder. The reason is that the flow of this energy will be different (i.e., in the opposite directions) through the CTs in the faulty feeder and the healthy feeders. In simple worlds this energy will be negative (i.e., in opposite direction from the reference current measurement direction) in the faulty feeder and positive (i.e., in the same direction with the reference current measurement direction) in a healthy feeder.

The embodiments disclosed herein relate to mechanisms for determining direction of an EF in a feeder of a high impedance grounded power system. In order to obtain such mechanisms there is provided an IED 200, a method performed by the IED 200, a computer program product comprising code, for example in the form of a computer program, that when run on an IED 200, causes the IED 200 to perform the method.

Methods for determining direction of an EF in a feeder of a high impedance grounded power system will now be disclosed.

Figure 2:
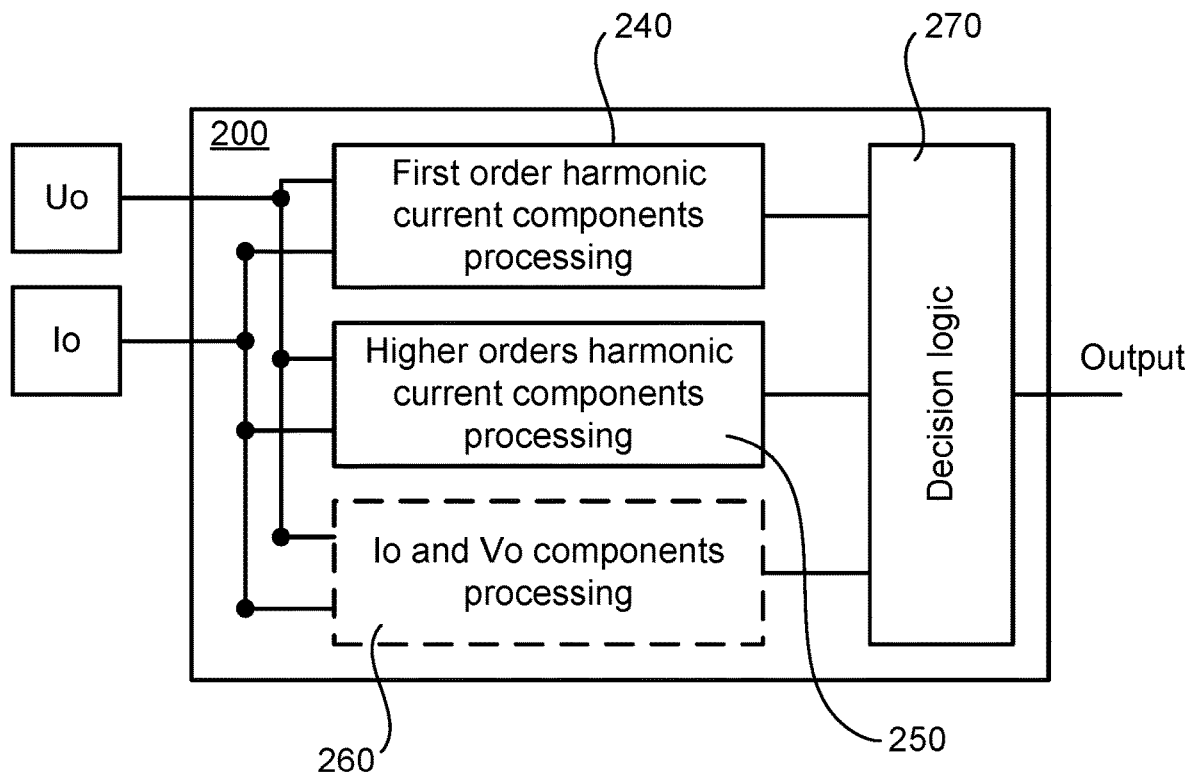
FIGS. 2 and 4 are schematic diagrams illustrating an IED according to embodiments.

FIG. 2 illustrates an IED 200 according to an embodiment. The IED 200 is configured to obtain measurements of residual voltage U0 and residual current Io. The blocks providing residual voltage U0 and residual current Io as input to the IED 200 are thus not part of the IED 200. The IED 200 comprises a first order harmonic current component processing block 240. The IED 200 comprises a higher order (i.e., higher than first order) harmonic current component processing block 250. The IED 200 comprises an (optional) residual voltage U0 and residual current Io components processing block 260. The IED 200 comprises a decision logic block 270. Operations of the blocks 240-270 will be disclosed with parallel reference to FIG. 3.

Figure 3:
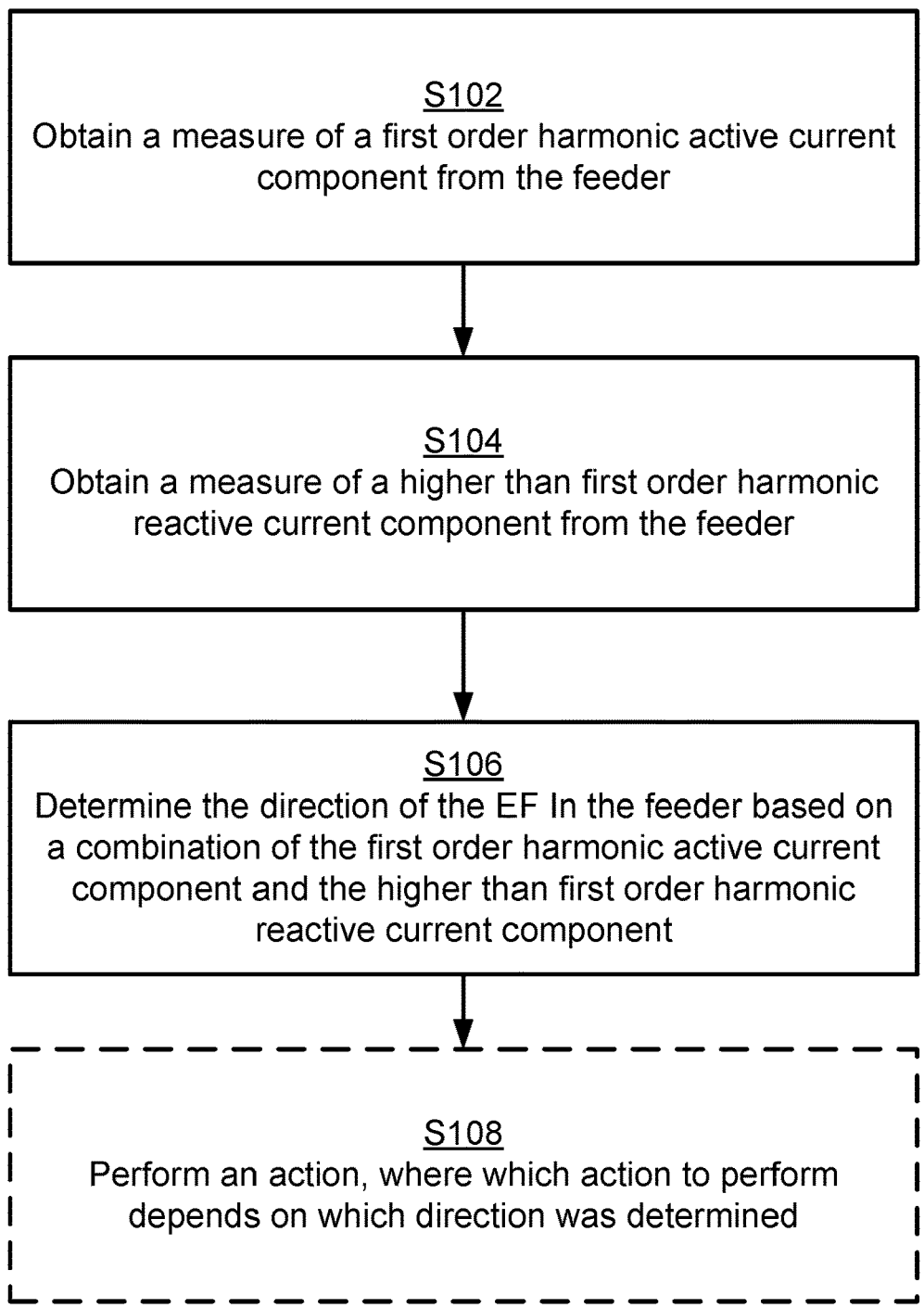
FIG. 3 is a flowchart of methods according to embodiments.

FIG. 3 is a flowchart illustrating embodiments of methods for determining direction of an EF in a feeder of a high impedance grounded power system. The methods are performed by the IED 200. The methods are advantageously provided as computer programs 1520.

In general terms, the direction of the EF is determined based on the first order harmonic (i.e., fundamental frequency) active current component and the higher than first order harmonic (i.e., higher harmonic) reactive current component.

S102: The IED 200 obtains a measure of a first order harmonic active current component derived from residual voltage and current of the feeder. A measure of the first order harmonic active current component might be repeatedly obtained at regular time intervals and at least one such measure is thus assumed to be obtained when the EF occurred. Hence, the measure is valid for when the EF occurred in the feeder. Hence, this implies that no fault inception detection is needed. Aspects of how to derive the measure of the first order harmonic active current component from residual voltage and current of the feeder will be disclosed below. The operations of S102 might be implemented in block 240.

The IED 200 obtains a measure of a higher than first order harmonic reactive current component derived from residual voltage and current of the feeder. A measure of the higher than first order harmonic reactive current component might be repeatedly obtained at regular time intervals and at least one such measure is thus assumed to be obtained when the EF occurred. Hence, the measure is valid for when the EF occurred in the feeder. Hence, this implies that no fault inception detection is needed. Aspects of how to derive the measure of the higher than first order harmonic reactive current component from residual voltage and current of the feeder will be disclosed below. The operations of S104 might be implemented in block 250.

S106: The IED 200 determines the direction of the EF in the feeder based on a combination of the first order harmonic active current component and the higher than first order harmonic reactive current component. Further aspects of this determination will be disclosed below. The operations of S106 might be implemented in block 270.

The IED 200 is thus configured to determine if the EF is in the forward or reverse direction from the point in network where the IED 200 is installed. The IED 200 is configured to operate for any type of high-impedance grounded network as mentioned above.

In some aspects the direction of the EF is determined based on the distribution of the active transient energy at fundamental frequency (i.e., first order harmonic) which is supplied from the fault point to initially charge all capacitances to ground in the zero-sequence system at the moment of EF inception. For high-impedance faults the steady state active current component will be used instead. This first principle is reflected in above step S102.

In some aspects the direction of the EF is determined based on the distribution of the reactive transient energy for higher harmonic (i.e., higher than first order harmonic) components at the moment of EF inception. This first principle is reflected in above step S104.

These two-basic principles of physics will be true for any type of EF in a high-impedance grounded network, including low-ohmic, high-ohmic, intermittent and restriking EFs (i.e., an EF that repeats itself). Consequently, the herein disclosed IED 200 is enabled to operate for all of them.

Residual current components proportional to the active and reactive energy (i.e., Io*cos(Φ) for fundamental frequency (i.e., first order harmonic) and Io*sin(Φ) for higher order harmonic (i.e., higher than first order harmonic) components) are used to mitigate issues with properly measuring the EF current and extracting the relevant signals (i.e., useful components) from the overall current signal.

For the first order harmonic current component only the Io*cos(Φ) component, i.e., the active component, has useful physical meaning, while the Io*sin(Φ) component, i.e., the reactive component, represents a disturbing part which might cause confusion in the IED 200 and cause wrong operation. For all higher than first order harmonic reactive current components the situation is the opposite where only the Io*sin(Φ) component, i.e., the reactive component, is usefully component with physical meaning while the Io*cos (Φ) component, i.e., the active component, represents a disturbing part which might cause confusion in the IED 200 and cause wrong operation.

Several instances of the herein disclosed methods can be implemented in one single IED 200. Thus, several feeders can be protected using a single IED 200.

Embodiments relating to further details of determining direction of an EF in a feeder of a high impedance grounded power system as performed by the IED 200 will now be disclosed.

There may be different conditions used when determining the direction of the EF in S106. According to a first example, the direction of the EF is determined to be forward direction when at least one of the measure of the first order harmonic active current component as averaged over time and on the measure of the higher than first order harmonic reactive current component as averaged over time is higher than a pre-set positive threshold value. According to a second example, the direction of the EF is determined to be reverse direction when at least one of the measure of the first order harmonic active current component as averaged over time and on the measure of the higher than first order harmonic reactive current component as averaged over time is lower than a pre-set negative threshold value. Yet further conditions could be used in combination with, or as alternative to, the conditions used in these two examples.

In some aspects, and as will be further disclosed below, at least two contributions of higher order reactive current components are summed before being processed by the decision logic block 270. In particular, according to an embodiment, the measure of the higher than first order harmonic reactive current component is representative of a sum of $N \geq 2$ harmonic reactive current components of orders 2 to N.

In some aspects, and as will be further disclosed below, the measure of the first order harmonic active current component is integrated, or averaged, over time and the measure of the higher than first order harmonic reactive current component is integrated, or averaged, over time. In particular, according to an embodiment, the direction of the EF is based on the measure of the first order harmonic active current component as averaged over time and on the measure of the higher than first order harmonic reactive current component as averaged over time.

In some aspects, and as will be further disclosed below, the measure of the first order harmonic active current component and the measure of the higher than first order harmonic reactive current component are compared to respective thresholds. In particular, according to an embodiment, when determining the direction of the EF in S106, the first order harmonic active current component is compared with a first pair of current threshold values defined by a positive value for forward direction and a different negative value for reverse direction, and the higher than first order harmonic reactive current component is compared with a second pair of threshold values. Hence, in some aspects four threshold values in total are used.

In some aspects, and as will be further disclosed below, the determining of the direction of the EF in S106 is based on an additional comparison with a lower set current limit value. In particular, according to an embodiment, the direction of the EF further is dependent on whether the first order harmonic active current component is above or below a low current limit value.

In some aspects, and as will be further disclosed below, the residual voltage U0 and the residual current Io are continuously monitored. In particular, according to an embodiment, the direction of the EF is further based on the round mean square (RMS) value of the phase to ground voltage (i.e., of the residual voltage U0) of the feeder and the RMS value of the absolute rectified current (i.e., of the residual current Io) of the feeder as valid for when the EF occurred. The operations of computing these RMS values might be implemented in block 260.

In some aspects, and as will be further disclosed below, the determining in S106 is based on binary-valued input signals. In particular, according to an embodiment, the direction of the EF is based on a combination of a binary value of the first order harmonic active current component and a binary value of the higher than first order harmonic reactive current component.

In some aspects, and as will be further disclosed below, the determining in S106 results in an action being performed by the IED 200. In particular, according to an embodiment, the IED 200 is configured to perform (optional) step S108:

S108: The IED performs an action. Which action to perform might depend on which direction was determined.

Non-limiting examples of actions are: issuing a warning if the direction is forward direction, initiating protection operation in forward direction if the determined direction is forward direction, and initiating protection operation in reverse direction if the determined direction is reverse direction.

The operations of S108 might be implemented in block 270.

Figure 4:
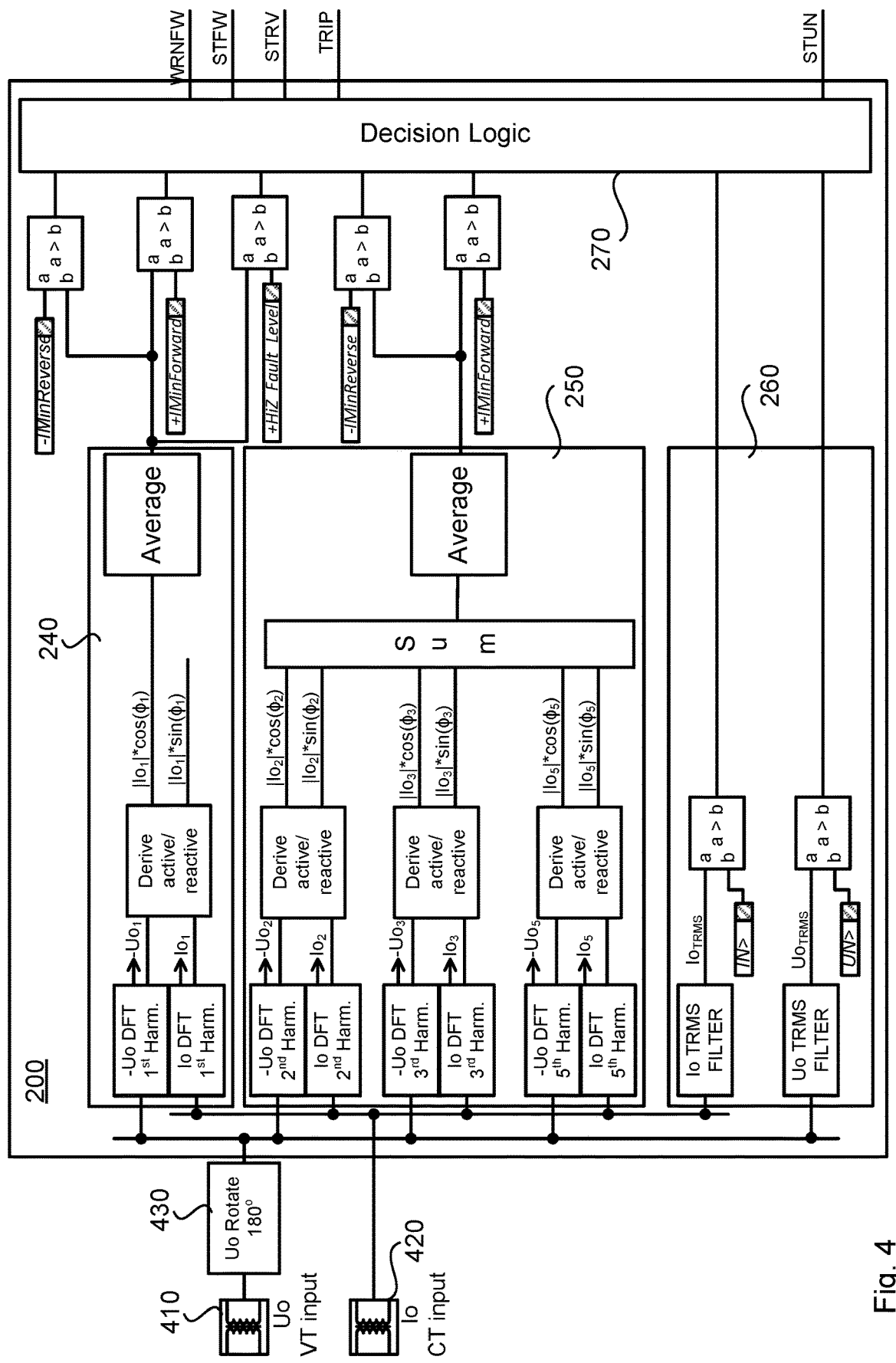

One embodiment for determining direction of an EF in a feeder of a high impedance grounded power system as performed by the IED 200 will now be disclosed with reference to the IED 200 of FIG. 4, disclosing the operations of the IED 200 of FIG. 2 according to one embodiment.

An input VT is connected to the residual voltage U0 and an input CT is connected to the residual current Io.

The residual voltage U0 signal is phase shifted 180 degrees (i.e., turned around, or rotated, 180 degrees).

By using a full cycle Discrete Fourier Transform (DFT) filter the first order harmonic (i.e., fundamental frequency) phasors ($-\overrightarrow{U0}_1$ and $\overrightarrow{Io}_1$) and respective higher than first order harmonic (i.e., higher order harmonics) phasors (for example the third order harmonics $-\overrightarrow{U0}_3$ and $\overrightarrow{Io}_3$) are individually derived.

The active and reactive current components are derived for the first order harmonic phasors and higher than first order harmonic phasors, respectively. As a result, the respective current components $Io*\cos(\Phi)$ and $Io*\sin(\Phi)$ are derived.

All higher than first order harmonics reactive currents $Io*\sin(\Phi)$ are summed to produce a total signal proportional to the harmonic reactive power.

The first order harmonic active current component (i.e., $|Io_1|*\cos(\Phi_1)$) is integrated. In general terms, this is implemented by means of a continuous integration. In some examples the integration period corresponds to one-and-a-half fundamental power system cycle. Integration is used to securely catch the transient active energy when distributed capacitances are charged at the moment of an EF inception. However, if this energy is of a continuous nature (e.g., as for high-impedance fault cases) the integration will still produce the correct current magnitude value but with a small-time delay. Correspondingly, the summed reactive current component is also integrated with similar reasoning as already previously described. In implementation in a numerical relay, integration corresponds to average value calculation. The set integration levels can be entered directly as equivalent current levels. In order to achieve a stable and reliable signal, only the useful components (i.e., the active and reactive components where needed according to the above) are integrated in time which makes these integral values proportional to the respective energy. However, these integral values can be scaled back to the measured current magnitude by using moving average. Only the sign of the calculated integrals (i.e., positive or negative) as valid for the EF is used to determine by the IED 200 to determine the direction of the EF. However, some minimum magnitude level (settable) of the integrated signal might be exceeded for security reasons and also to avoid any possible issues with relay hardware accuracy.

Integrated (i.e., averaged) values of $Io*\cos(\Phi)$ might be used since the instantaneous values of $Io*\cos(\Phi)$ will vary during the transient period when the EF occurs. This averaged value will correspond to the actual energy stored in the distributed capacitances. In the feeder where the EF is located (i.e., in the faulty feeder) this averaged value will be always positive (due to inventing the phasor $\overrightarrow{U0}$ (i.e., using the phasor $-\overrightarrow{U0}$)), while in all feeders which see the reverse direction of the EF (i.e., heathy feeders) this averaged value will always be negative. Thus, settings two simple current threshold levels (one positive and one negative) is one way to accomplish accurate determination of the direction of the EF.

The two integrated quantities are continuously compared with two pre-set current levels (denoted IMinForward and IMinReverese). This comparison is performed separately for the two integrated current components. The reverse level is taken with a negative sign. As a result, corresponding binary signals are formed indicating if the integrated current components are above or below the set levels.

Comparison with a lower set current limit value for the integrated first order harmonic active current component is performed. This comparison might be performed in order to achieve detection of high ohmic faults in the forward direction.

The average values of the residual voltage U0 and residual current Io is continuously monitored.

Comparisons of the binary signals is made in decision logic to securely and properly determine the EF direction. The decision logic implements adequate (i.e., as set by the end user) start and trip time delays which should elapse before the appropriate action is taken.

As a result of the comparisons in the decision logic, various binary signals are given as outputs, depending on the actual fault position, as listed below.

WRNFW represents a warning for possible EF in the forward direction. This signal is activated as soon as a transient signal in the forward direction is captured. This signal can be used for high-impedance grounded cable networks to warn users about possible cable insulation deterioration.

STFW represents start of the protection operation in the forward direction (after a set time delay).

STRV represents start of the protection operation in the reverse direction (after a set time delay).

TRIP represents tripping operation of the function for fault in the forward direction (after a set time delay).

STUN represents start of the EF protection function when the magnitude of the fundamental frequency residual voltage U01 exceeds a pre-set level.

Yet further details of determining direction of an EF in a feeder of a high impedance grounded power system as performed by the IED 200 will now be disclosed.

This flow of active energy at the moment of the EF will not be influenced by the exact tuning of the Petersen coil. For an over-compensated system, for example, the reactive current in the thus faulty feeder and the capacitive current in the healthy feeder(s) may flow in the same direction. Hence, directional relays considering a value of the first order harmonic reactive current component $Io*\sin(\Phi)$ may not perform correctly. However, the herein disclosed principles based on transient active power/energy will operate correctly in both faulty and healthy feeders. Therefore, this principle will operate equally well for either under-compensated or over-compensated systems. Consequently, it will neither be dependent on the physical location nor the number of Petersen coils used in the protected power network.

Presence of the resistor in the star point (e.g., in parallel with the Petersen coil) will increase the active residual current component (i.e., Io*cos(Φ))) in the faulty feeder only and in the right direction (i.e., providing an additional positive value of the integral) enabling simple operation of the methods of the herein disclosed embodiments in the forward direction in the faulty feeder only.

Similarly, in case of an EF with higher value of the fault resistance (i.e., Rf>0Ω) the steady-state active residual current component (i.e., Io*cos(Φ))) will also increase the value of the integral in the faulty feeder and again in the right direction (i.e., providing an additional positive value) due to active power dissipation on the fault resistance. This will also enable the methods of the herein disclosed embodiments to operate in the forward direction even during high impedance faults.

For very high impedance faults the sensitivity of the methods of the herein disclosed embodiments will only be limited by the available current magnitude to be measured. Using the notation in FIG. 1, for high impedance fault cases the available active primary fault current magnitude $Io_{active}$ can be approximated as follows:

$$Io_{active} \sim \frac{U_{Ph-Ph}}{\sqrt{3} * (R_f + R)}$$

For all higher than first order harmonics the Petersen coils will become $h^2$ times higher impedance than the corresponding capacitive reactance, where h≥2 is the harmonic number. Consequently, already for the second harmonic component (i.e., h=2) the Petersen coils will have 4 times higher impedance than the distributed capacitances. As a result, all Petersen coils might simply be omitted from the zero-sequence equivalent circuit for all higher than first order harmonics. The equivalent circuit shown for the isolated system in FIG. 1 can be used for all higher than first order harmonics even for the Petersen coil grounded systems. Subsequently the fundamental frequency based Io*sin(Φ) principle for isolated system can be now applied to the all higher than first order harmonic components for Petersen coil grounded system or even in any high impedance grounded system. Because all higher than first order harmonics will be present mostly during the transient part of the EF, these harmonic components will behave in the similar transient way as already explained for the first order harmonic active current component Io*cos(Φ). Consequently, the same integration principle can be used to capture the transient harmonic reactive energy exchange between the capacitors and the harmonic voltage source located at the fault point.

In order to simplify the calculations, the following sum is firstly formed:

$$\Sigma_{h=2}^{K} Io_h * \sin(\Phi)_h$$

Here, K is the maximum order of harmonic h which can be measured by the relay (i.e., in practice limited by the sampling rate of the relay). For practical power systems it is typically sufficient if K≥5 (i.e., that at least the $2^{nd}$ to the $5^{th}$ harmonics are used to form this sum). This summed value is proportional to the total harmonic reactive power seen by the IED during an EF.

The integration (i.e., averaging) of this summed value can be arranged in the same way as described previously for the first order harmonic active current component Io*cos(Φ). Because everything is scaled back to current, even the same set levels for the forward and the reverse directions can be used.

Figure 5:
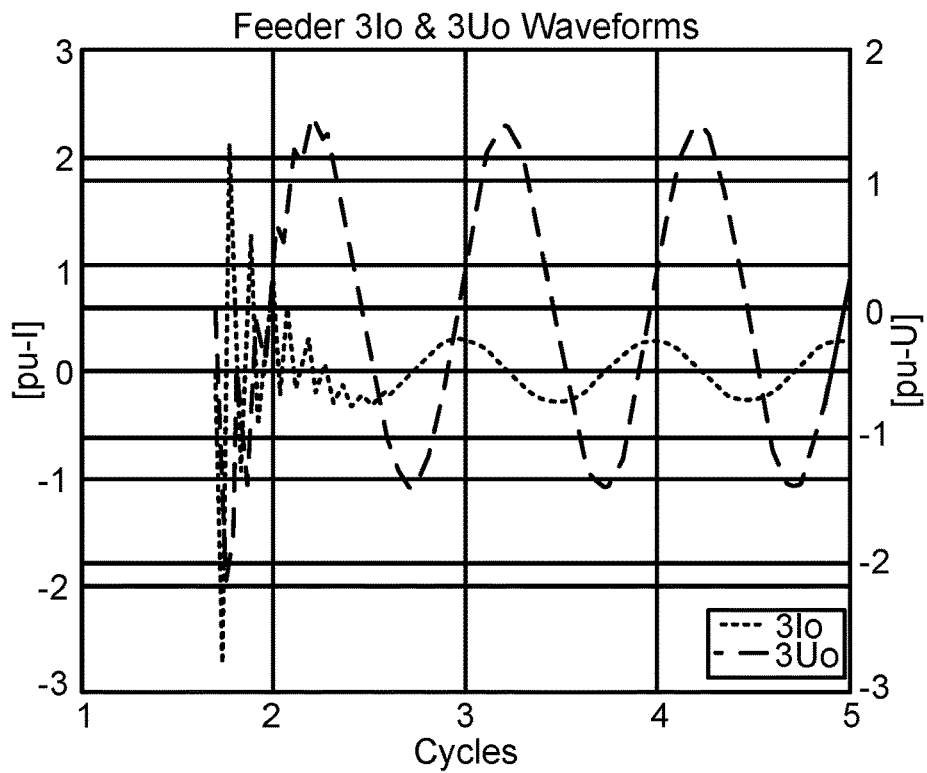
FIGS. 5, 6, 7, and 8 show examples of signals for a healthy feeder according to an embodiment.
Figure 6:
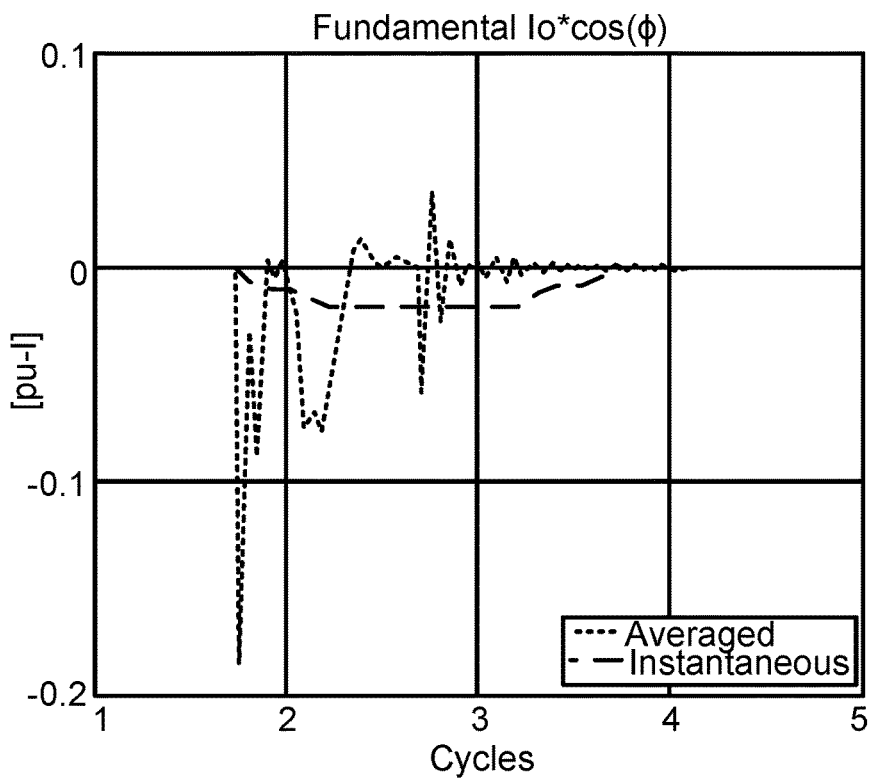
Figure 7:
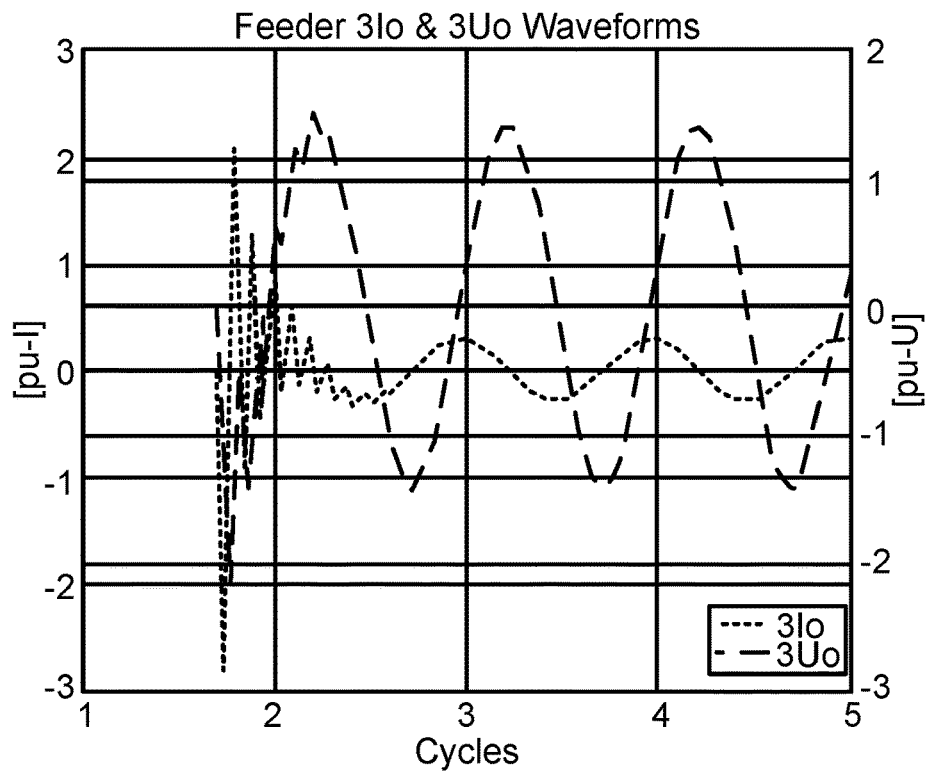
Figure 8:
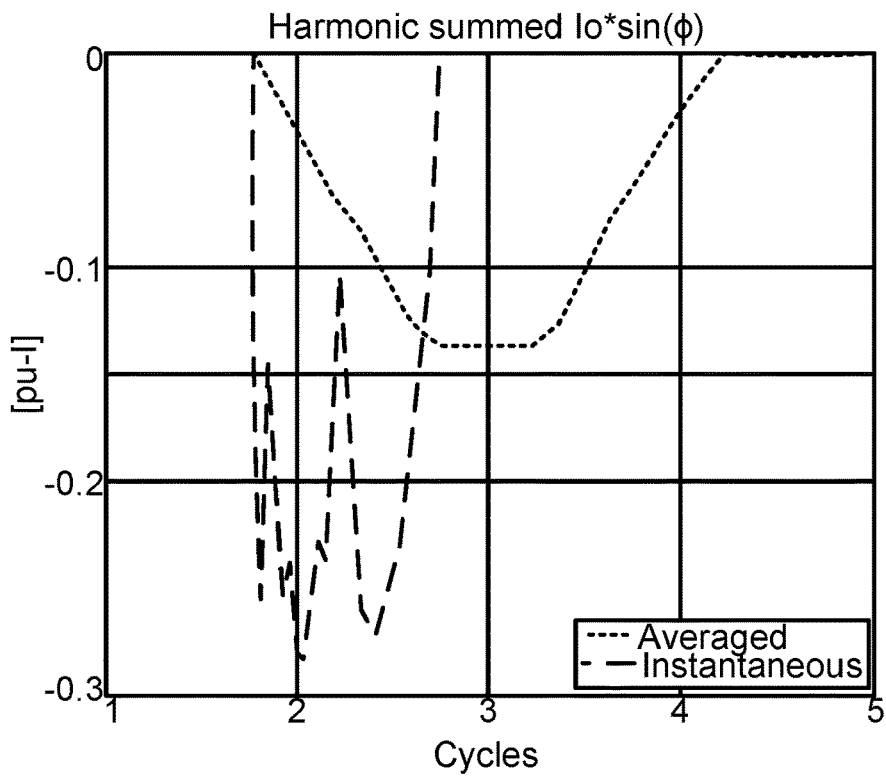
Figure 9:
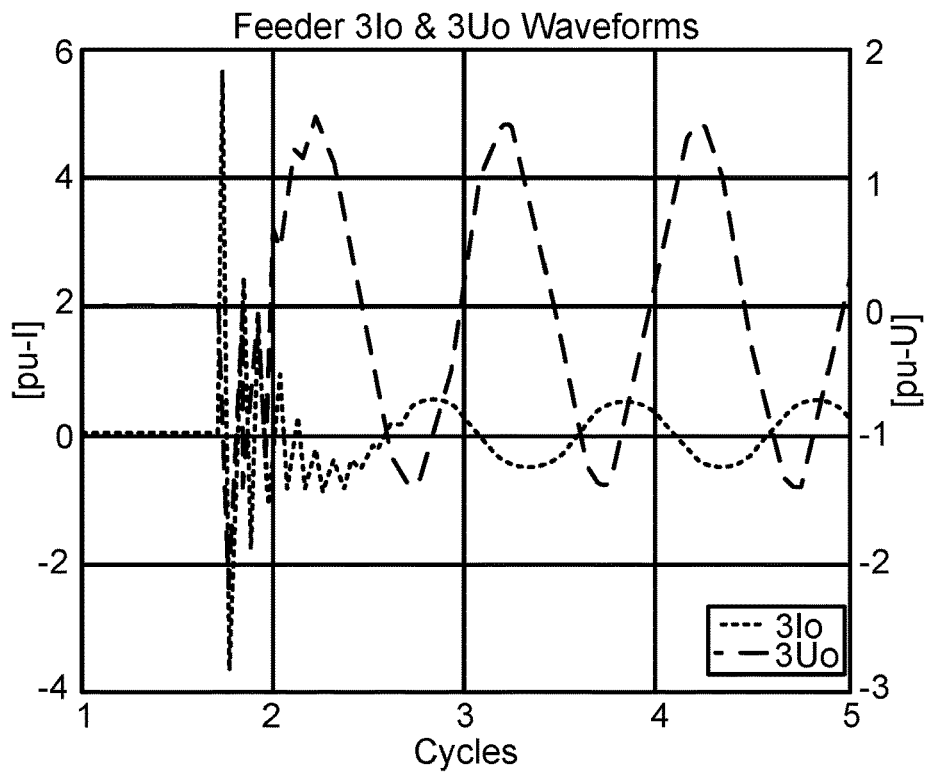
FIGS. 9, 10, 11, and 12 show examples of signals for a faulty feeder according to an embodiment.
Figure 10:
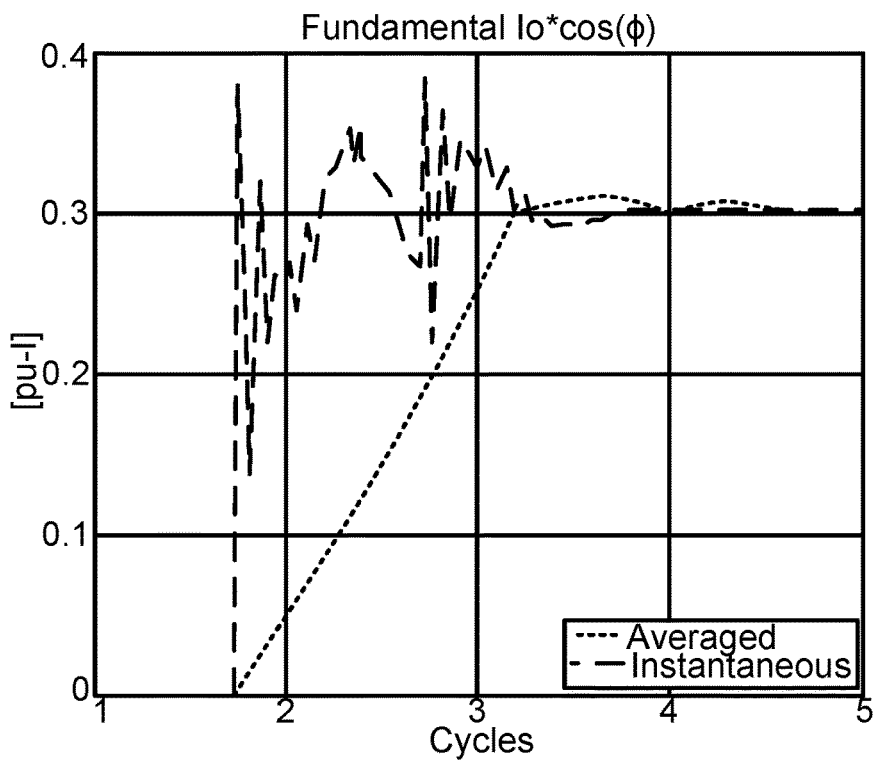
Figure 11:
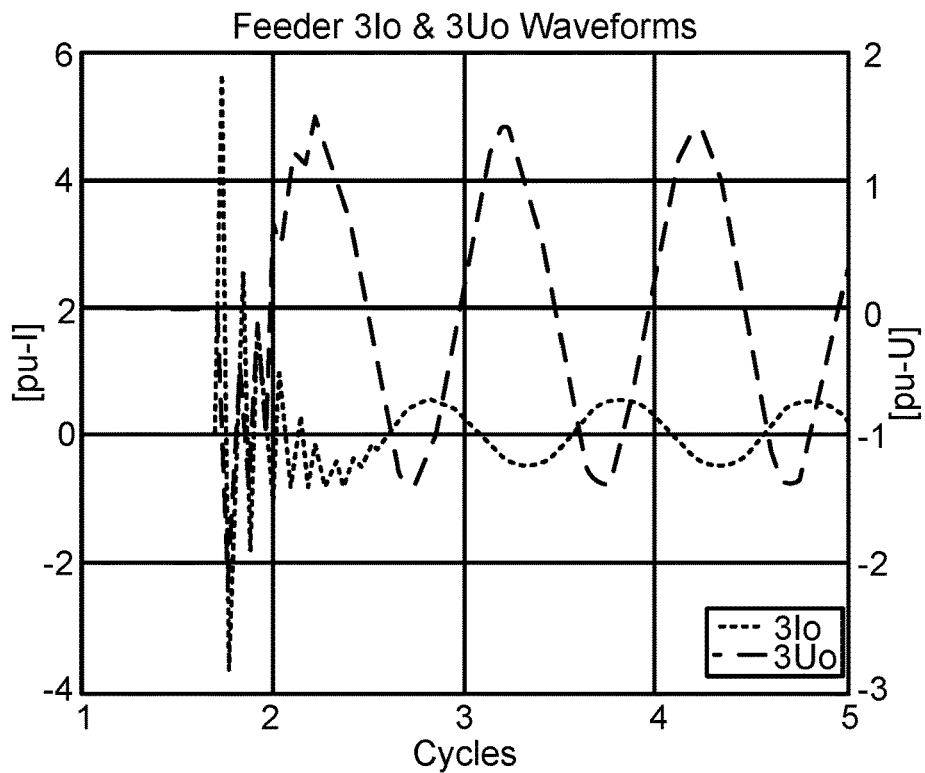
Figure 12:
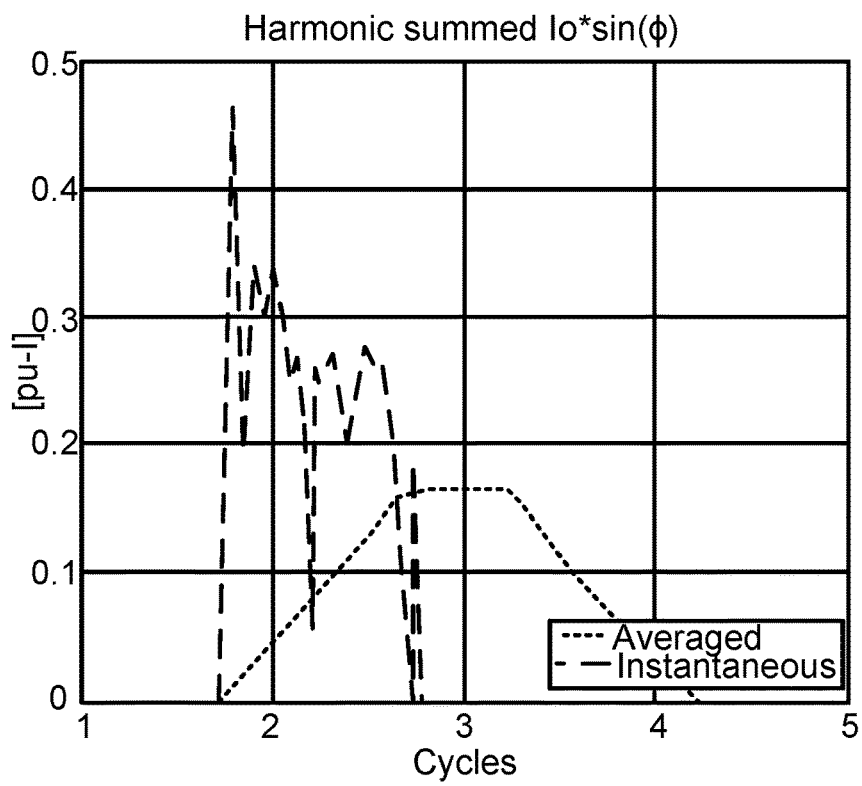

FIGS. 5, 6, 7, and 8 show examples of signals for a healthy feeder. FIGS. 5 and 6 show waveforms for active power signals relating to the first order harmonic active current component and FIGS. 7 and 8 show waveforms for reactive power signals relating to the higher than first order harmonic reactive current component. FIGS. 9, 10, 11, and 12 show examples of signals for a faulty feeder. FIGS. 9 and 10 show waveforms for active power signals relating to the first order harmonic active current component and FIGS. 11 and 12 show waveforms for reactive power signals relating to the higher than first order harmonic reactive current component. The presence of a grounding resistor is clearly visible in FIG. 10 because the averaged value of the Io*cos(Φ) component does not drop to zero after the transient for a faulty feeder, but it drops to zero for a healthy feeder as shown in FIG. 6.

Figure 13:
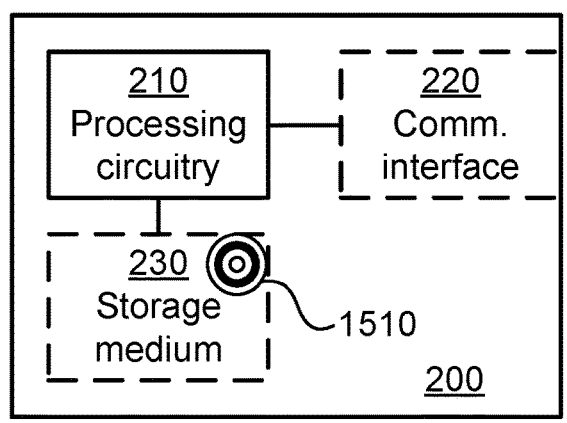
FIG. 13 is a schematic diagram showing functional units of an IED according to an embodiment.

FIG. 13 schematically illustrates, in terms of a number of functional units, the components of an IED 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1510 (as in FIG. 15), e.g., in the form of a storage medium 230. The processing circuitry 210 may further be provided as at least one application specific integrated circuit (ASIC), or field programmable gate array (FPGA).

Particularly, the processing circuitry 210 is configured to cause the IED 200 to perform a set of operations, or steps, as disclosed above. For example, the storage medium 230 may store the set of operations, and the processing circuitry 210 may be configured to retrieve the set of operations from the storage medium 230 to cause the IED 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The IED 200 may further comprise a communications interface 220 at least configured for communications with feeders of the high impedance grounded power system that includes a zero-sequence equivalent circuit 100. As such the communications interface 220 may comprise one or more transmitters and receivers, comprising analogue and digital components. The processing circuitry 210 controls the general operation of the IED 200, e.g., by sending data and control signals to the communications interface 220 and the storage medium 230, by receiving data and reports from the communications interface 220, and by retrieving data and instructions from the storage medium 230. Other components, as well as the related functionality, of the IED 200 are omitted in order not to obscure the concepts presented herein.

Figure 14:
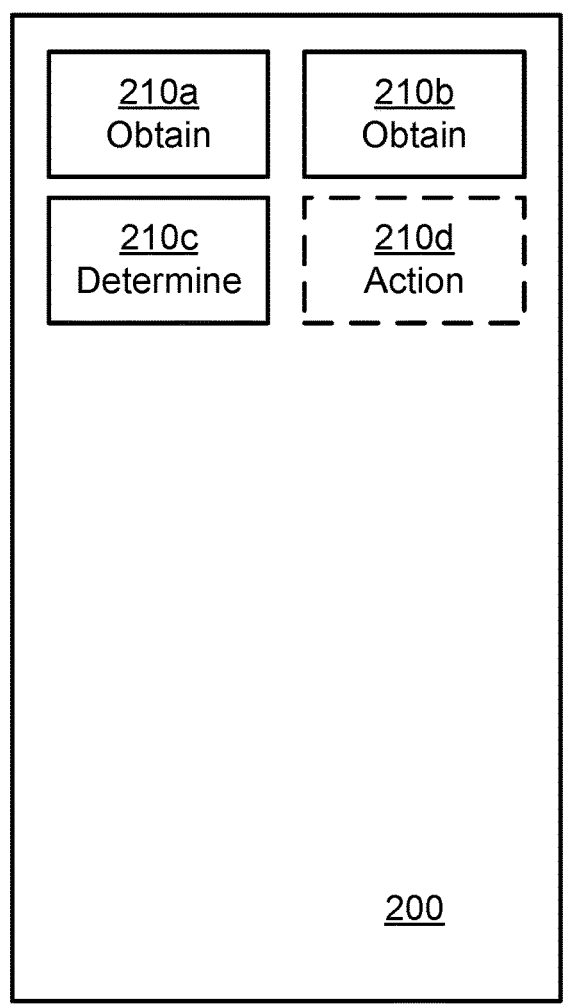
FIG. 14 is a schematic diagram showing functional modules of an IED according to an embodiment.

FIG. 14 schematically illustrates, in terms of a number of functional modules, the components of an IED 200 according to an embodiment. The IED 200 of FIG. 14 comprises a number of functional modules; an obtain module 210a configured to perform step S102, an obtain module 210b configured to perform step S104, and a determine module 210c configured to perform step S106. The IED 200 of FIG. 14 may further comprise a number of optional functional modules, such as an action module 210d configured to perform step S108.

With reference to FIG. 2, module 210a might implement the functionality of block 240, module 210b might implement the functionality of block 250, and modules 210c and 210d might implement the functionality of block 270. In general terms, each functional module 210a-210d may in one embodiment be implemented only in hardware and in another embodiment with the help of software, i.e., the latter embodiment having computer program instructions stored on the storage medium 230 which when run on the processing circuitry makes the IED 200 perform the corresponding steps mentioned above in conjunction with FIG. 14. It should also be mentioned that even though the modules correspond to parts of a computer program, they do not need to be separate modules therein, but the way in which they are implemented in software is dependent on the programming language used. Preferably, one or more or all functional modules 210a-210d may be implemented by the processing circuitry 210, possibly in cooperation with the communications interface 220 and/or the storage medium 230. The processing circuitry 210 may thus be configured to from the storage medium 230 fetch instructions as provided by a functional module 210a-210d and to execute these instructions, thereby performing any steps as disclosed herein.

The IED 200 may be provided as a standalone device or as a part of at least one further device. A first portion of the instructions performed by the IED 200 may be executed in a first device, and a second portion of the of the instructions performed by the IED 200 may be executed in a second device; the herein disclosed embodiments are not limited to any particular number of devices on which the instructions performed by the IED 200 may be executed. Hence, the methods according to the herein disclosed embodiments are suitable to be performed by an IED 200 residing in a cloud computational environment. Therefore, although a single processing circuitry 210 is illustrated in FIG. 13 the processing circuitry 210 may be distributed among a plurality of devices, or nodes. The same applies to the functional modules 210a-210d of FIG. 14 and the computer program 1520 of FIG. 15.

Figure 15:
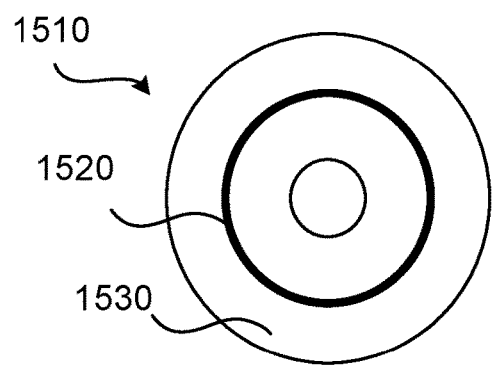
FIG. 15 shows one example of a computer program product comprising computer readable storage medium according to an embodiment.

FIG. 15 shows one example of a computer program product 1510 comprising computer readable storage medium 1530. On this computer readable storage medium 1530, a computer program 1520 can be stored, which computer program 1520 can cause the processing circuitry 210 and thereto operatively coupled entities and devices, such as the communications interface 220 and the storage medium 230, to execute methods according to embodiments described herein. The computer program 1520 and/or computer program product 1510 may thus provide means for performing any steps as herein disclosed.

In the example of FIG. 15, the computer program product 1510 is illustrated as an optical disc, such as a CD (compact disc) or a DVD (digital versatile disc) or a Blu-Ray disc. The computer program product 1510 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1520 is here schematically shown as a track on the depicted optical disk, the computer program 1520 can be stored in any way which is suitable for the computer program product 1510.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

What is claimed is:

1. A method for determining direction of an earth fault (EF) in a feeder of a high impedance grounded power system, the method being performed by an Intelligent Electronic Device (IED), the method comprising:
obtaining a measure of a first order harmonic active current component derived from residual voltage and current of the feeder when the EF occurred in the feeder;
obtaining a measure of a higher order harmonic reactive current component derived from the residual voltage and current of the feeder when the EF occurred in the feeder; and
determining the direction of the EF in the feeder based on a combination of the first order harmonic active current component and the higher order harmonic reactive current component, wherein, when determining the direction of the EF, the first order harmonic active current component is compared with a first pair of current threshold values defined by a positive value for forward direction and a different negative value for reverse direction, and the higher order harmonic reactive current component is compared with a second pair of threshold values.

2. The method according to claim 1, wherein the direction of the EF is based on the measure of the first order harmonic active current component as averaged over time and on the measure of the higher order harmonic reactive current component as averaged over time.

3. The method according to claim 1, wherein the measure of the higher order harmonic reactive current component is representative of a sum of N harmonic reactive current components of orders 2 to N, where N is an integer greater than or equal to 2.

4. The method according to claim 1, wherein the direction of the EF is determined to be forward direction when at least one of the measure of the first order harmonic active current component as averaged over time and the measure of the higher order harmonic reactive current component as averaged over time is higher than a pre-set positive threshold value.

5. The method according to claim 1, wherein the direction of the EF is determined to be reverse direction when at least one of the measure of the first order harmonic active current component as averaged over time and the measure of the higher order harmonic reactive current component as averaged over time is lower than a pre-set negative threshold value.

6. The method according to claim 1, wherein the direction of the EF further is dependent on whether the first order harmonic active current component is above or below a low current limit value.

7. The method according to claim 1, wherein the direction of the EF is based on a combination of a binary value of the first order harmonic active current component and a binary value of the higher order harmonic reactive current component.

8. The method according to claim 1, wherein the direction of the EF is further based on round mean square value of phase to ground voltage of the feeder and round mean square value of absolute rectified current of the feeder as valid for when the EF occurred.

9. The method according to claim 1, wherein determining the direction of the EF comprises determining that direction is a forward direction, the method further comprising issuing a warning.

10. The method according to claim 1, wherein determining the direction of the EF comprises determining that direction is a forward direction, the method further comprising initiating protection operation in the forward direction.

11. The method according to claim 1, wherein determining the direction of the EF comprises determining that direction is a reverse direction, the method further comprising initiating protection operation in the reverse direction.

12. An intelligent electronic device (IED) for determining direction of an earth fault (EF) in a feeder of a high impedance grounded power system, the TED comprising processing circuitry that is configured to cause the TED to:
   obtain a measure of a first order harmonic active current component derived from residual voltage and current of the feeder when the EF occurred in the feeder;
   obtain a measure of a higher order harmonic reactive current component derived from residual voltage and current of the feeder when the EF occurred in the feeder; and
   determine a direction of the EF in the feeder based on a combination of the first order harmonic active current component and the higher order harmonic reactive current component, wherein, when determining the direction of the EF, the first order harmonic active current component is compared with a first pair of current threshold values defined by a positive value for forward direction and a different negative value for reverse direction, and the higher order harmonic reactive current component is compared with a second pair of threshold values.

13. The IED according to claim 12, wherein the direction of the EF is based on the measure of the first order harmonic active current component as averaged over time and on the measure of the higher order harmonic reactive current component as averaged over time.

14. The IED according to claim 12, wherein the measure of the higher order harmonic reactive current component is representative of a sum of N harmonic reactive current components of orders 2 to N, where N is an integer greater than 2.

15. The TED according to claim 12, wherein the direction of the EF is determined to be forward direction when at least one of the measure of the first order harmonic active current component as averaged over time and the measure of the higher order harmonic reactive current component as averaged over time is higher than a pre-set positive threshold value; and
   wherein the direction of the EF is determined to be reverse direction when at least one of the measure of the first order harmonic active current component as averaged over time and the measure of the higher order harmonic reactive current component as averaged over time is lower than a pre-set negative threshold value.

16. The IED according to claim 12, wherein the direction of the EF is based on a combination of a binary value of the first order harmonic active current component and a binary value of the higher order harmonic reactive current component.

17. The IED according to claim 12, wherein the direction of the EF is further based on round mean square value of phase to earth voltage of the feeder and round mean square value of absolute rectified current of the feeder as valid for when the EF occurred.

18. A non-transitory computer readable medium storing a computer program for determining direction of an earth fault (EF) in a feeder of a high impedance grounded power system, the computer program comprising computer code which, when run on processing circuitry of an intelligent electronic device (IED) causes the IED to:
   obtain a measure of a first order harmonic active current component derived from residual voltage and current of the feeder when the EF occurred in the feeder;
   obtain a measure of a higher order harmonic reactive current component derived from residual voltage and current of the feeder when the EF occurred in the feeder; and
   determine the direction of the EF in the feeder based on a combination of the first order harmonic active current component and the higher order harmonic reactive current component, wherein, when determining the direction of the EF, the first order harmonic active current component is compared with a first pair of current threshold values defined by a positive value for forward direction and a different negative value for reverse direction, and the higher order harmonic reactive current component is compared with a second pair of threshold values.

19. The non-transitory computer readable medium of claim 18, wherein the direction of the EF is determined to be forward direction when at least one of the measure of the first order harmonic active current component as averaged over time and the measure of the higher order harmonic reactive current component as averaged over time is higher than a pre-set positive threshold value; and
   wherein the direction of the EF is determined to be reverse direction when at least one of the measure of the first order harmonic active current component as averaged over time and the measure of the higher order harmonic reactive current component as averaged over time is lower than a pre-set negative threshold value.

20. The non-transitory computer readable medium of claim 18, wherein the measure of the higher order harmonic reactive current component is representative of a sum of N harmonic reactive current components of orders 2 to N, where N is an integer greater than 2.

* * * * *

UNITED STATES PATENT AND TRADEMARK OFFICE
CERTIFICATE OF CORRECTION

| | |
|---|---|
| PATENT NO. | : 11,726,129 B2 |
| APPLICATION NO. | : 16/991637 |
| DATED | : August 15, 2023 |
| INVENTOR(S) | : Zoran Gajic |

It is certified that error appears in the above-identified patent and that said Letters Patent is hereby corrected as shown below:

In the Claims

In Column 15, in Claim 12, Line 16, delete "TED" and insert -- IED --.

In Column 15, in Claim 12, Line 17, delete "TED" and insert -- IED --.

In Column 15, in Claim 15, Line 46, delete "TED" and insert -- IED --.

Signed and Sealed this
Sixteenth Day of July, 2024

Katherine Kelly Vidal
*Director of the United States Patent and Trademark Office*